United States Patent [19]

Fucito

[11] 3,999,137
[45] Dec. 21, 1976

[54] LOW PASS ACTIVE FILTER APPARATUS
[75] Inventor: Dermot Thomas Fucito, Fairport, N.Y.
[73] Assignee: Stromberg-Carlson Corporation, Rochester, N.Y.
[22] Filed: Jan. 2, 1976
[21] Appl. No.: 646,229
[52] U.S. Cl. .............................. 328/167; 328/151; 333/70 CR; 179/15 A
[51] Int. Cl.² ......................................... H03B 1/04
[58] Field of Search ................. 328/151, 165, 167; 333/70 R, 70 CR; 179/15 A, 15 BL; 307/233

[56] References Cited
UNITED STATES PATENTS

| | | | |
|---|---|---|---|
| 3,537,019 | 10/1970 | Reichard | 328/165 |
| 3,696,252 | 10/1972 | Chapman | 328/167 X |
| 3,838,346 | 9/1974 | Cox | 328/151 |
| 3,919,648 | 11/1975 | Uetrecht | 328/167 |

Primary Examiner—John S. Heyman
Attorney, Agent, or Firm—William F. Porter, Jr.; Michael F. Oglo

[57] ABSTRACT

The subject of the disclosure is low-pass filter apparatus for use in filtering out noise in a signal channel for propagating PAM signals. A sample and hold circuit which operates in synchronism with the presence of PAM pulses is provided as the input section. The output of the sample and hold circuit is applied to a four-pole, low-pass, RC active filter network. An adjustment is made to the active filter network such that the filter network's low frequency complex pole pair is changed to provide compensation for an undesired roll-off of band pass in the intended in-band region due to the frequency response characteristics of the sample and hold circuit. The resultant apparatus provides a significant reduction in active filter gain required for a given PAM duty cycle. It also provides increased noise rejection capability in the out-of-band region of operation.

4 Claims, 8 Drawing Figures $$H_s = \frac{-(s^2 + \frac{1}{R_{60} R_{62} C_{64} C_0})}{s^2(1+\frac{C_{64}}{C_0}) + s(\frac{\sigma_0 C_{64}}{C_0} + \frac{R_{64}+R_{16}}{R_{16} R_{64} C_0} + \frac{1}{R_{58} C_{54}}) + (\frac{1}{R_{60} R_{62} C_0 C_{64}} + \frac{\sigma_0}{R_{16} C_0})}$$

$$\frac{\alpha B A_2}{T_1 T_2 (1 - \frac{1}{A_1})}{s^2 + s(\frac{B+1-A_2}{T_2}) + \frac{BA_2}{T_1 T_2}}$$

WHERE: $\sigma_0 = \frac{1}{R_{58}(C_{54}+C_{56})}$ ;

$C_0 = \frac{C_{54} C_{56}}{C_{54}+C_{56}}$ ;

$\alpha = \frac{R_{82}}{R_{74}}$ ;

$B = \frac{R_{80}}{R_{76}}$ ;

$A_2 = \frac{R_{90}}{R_{89}} + 1$ ;

$T_1 = R_{82} C_{78}$ ;

$T_2 = R_{80} C_{86}$ ;

LOW PASS ACTIVE FILTER APPARATUS

BACKGROUND OF THE INVENTION

1. Field of the Invention

The present invention relates to improvements in low-pass, RC active filter network apparatus. More particularly it relates to improvements which are of special utility in applications of such apparatus for the reduction of noise or other higher frequency signal components in a signal channel carrying pulse amplitude modulation (PAM) signals.

2. Description of the Prior Art

It has heretofore been considered that the application of low-pass RC active filter networks for noise rejection in conjunction with a PAM channel required as active filter network gain approximately equal to the reciprocal of the duty cycle of the PAM signal. This level of gain was only achieved by the cascade connection of two or more four-pole active filter network stages.

The use of a low-pass RC active filter network having at its inputs an analog circuit type multiplexing switch which operates in synchronism with PAM pulses is known in the construction of transmission equipment for telephonic communications. However, prior to the present invention, the inherent degradation of in-band frequency response was merely offset by the cascade connection of more, or higher gain, active device stages.

In addition to the aforementioned considerations given to gain requirements and band pass characteristics, there is interest in improvement of the out-band rejection capabilities of such filter network apparatus.

SUMMARY OF THE INVENTION

The subject of this invention is low-pass, RC active filter network apparatus for reducing noise or eliminating other higher frequency components in a PAM signal channel. The input section of the apparatus is an analog circuit type multiplexing switch operated to close in synchronously timed relationship to the appearance of PAM signal pulses. The switch operates to close a capacitor charge circuit, and the charge across the capacitor is applied to the input of a four-pole, low-pass, RC active filter network through a buffering operational amplifier. This network ahead of the active filter network constitutes a so-called "sample and hold", or "box car" circuit. The output of a sample and hold circuit has a frequency response that behaves as a $$\frac{\sin e \, x}{x}$$

filter, with attenuation nulls at the sampling frequency and multiples of the sampling frequency. The null at the sampling frequency causes an undesired roll-off of the in-band response. The in-band frequency roll-off due to the sample and hold circuit can be almost completely compensated for by a small adjustment in the nature of the connection of a resistance within the network of resistances and capacitance elements of the low frequency pole pair active filter stage of the four-pole, low-pass active filter network. The preferred procedure for determining the value of the resistance which effects the compensation is empirical. By trial and error a value of compensating impedance is found which returns the in-band frequency response of the apparatus to the condition of flat in-band response provided by the active network filter without any sample and hold circuit ahead of its input. An alternate procedure for determining the value of compensating impedance would be the solution of the transfer function equations for the specific sample and hold circuit active filter network (including the compensation resistance) to yield a value or resistance which produces a function which complements the roll-off characteristic.

An object of the invention is to provide low-pass, RC active filter circuit apparatus for use in a PAM channel requiring less active device gain than heretofore possible.

Another object is to provide apparatus of the aforesaid type which is versatile in its compatability with different duty cycles characteristics of PAM signals.

Still another object is to provide a low-pass, RC active filter network having improved out-of-band rejection characteristics and in turn fewer active network stages.

Other objects, features and advantages of the present invention will be clearer and more fully understood from the following detailed descripton of a preferred embodiment thereof, when read with the appended drawing wherein:

DESCRIPTION OF THE PREFERRED EMBODIMENT

Figure 1:
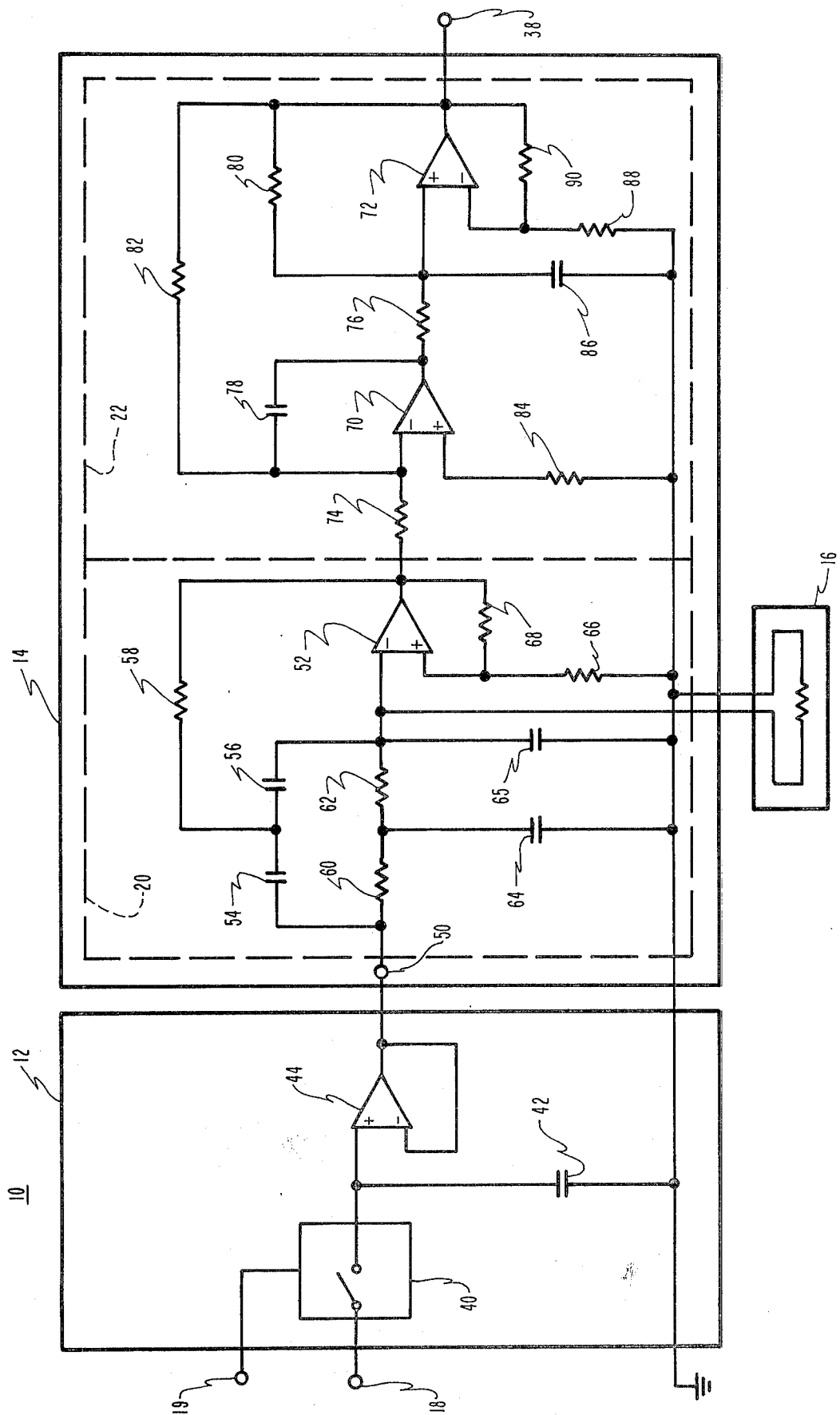
FIG. 1 is a diagram, partially in block form, and partially in schematic form, of low-pass, RC active filter apparatus constructed in accordance with the present invention.
Figures 2, 7:
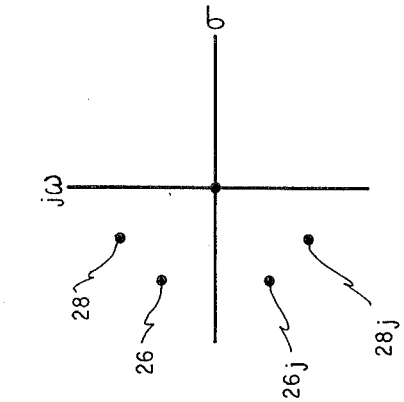
FIG. 2 is a s-plane diagram depicting an illustrative pattern of location of the complex pole pairs, which constitutes an electronic engineering design characteristic of a four-pole, low-pass, RC active filter network.
FIG. 7 is an equation representng the transfer function of the four-pole, low-pass, RC filter network stage with frequency response resistor attached.

Referring now to the drawing and in particular to FIG. 1 low-pass, RC active filter network apparatus 10, in accordance with the present invention includes a sample and hold circuit 12, a four-pole, low-pass, RC active filter network 14, and a frequency response compensation resistor 16. An illustrative example of the use of apparatus 10 is to provide a band pass in the frequency range between 300 cycles and about 4 KHz in transmission equipment for telephonic communication through which pulse amplitude modulated (PAM) signals are propagated. As an illustration of the signal characteristic, PAM signals may have a pulse rate of 8 KHz and a pulse width of 4 μ Sec. Input terminal 18 is connected to a line (not shown) along which the PAM signals pass. A multiplexing system (not shown) which is conventional and not part of the invention, applies a time slot pulse signal to another input terminal 19. These time slot pulses are in synchronously timed relationship to the appearance of PAM pulses. In and of itself, RC active filter network 14 is a conventional Cauer CC-4-25-53 type low-pass filter having two sections 20 and 22. Section 20 is a conventional RC twin-T active filter circuit, and section 22 is a conventional DeBoo dual integrator active filter circuit. As will be understood by those having average skill in the art, one of 25-53 type low-pass filter having two sections 20 and 22. Section 20 is a conventional RC twin-T active filter circuit, and section 22 is a conventional DeBoo dual integrator active filter circuit. As will be understood by those having average skill in the art, one of the analytical representations used in electronic engineering to describe an active four-pole Cauer filter is the pattern of location of four points 26, 26j, and 28, 28j, FIG. 2, in relation to s-plane coordinates. The x-axis coordinate is designated the σ-axis and the Y-axis is designated the jω-axis. Points 26, 26j, are the low frequency complex pole pair. They are located at the shorter of the radial distances from the origin of the s-plane coordinates. They are a characteristic of section 20. Section 20 is denominated the low frequency pole pair section of filter 14. Points 28, 28j are the high frequency complex pole pair. The latter are located at the longer of the radial distances from the origin and are a characteristic of section 22, which is denominated the high frequency pole pair section. It is to be understood that the s-plane diagram shown in FIG. 2 is purely an illustrative example of some Cauer filter network and, not necessarily that for network 14. It is also to be understood that it represents the pattern of location prior to connection of either sample and hold circuit 12 at its front end, or the connection of compensation resistor 16 thereto. Compensation resistor 16 is connected to a network of resistors, capacitors and an operational amplifier within low frequency pole pair filter section 20. Both filter sections 20 and 22 are second-order type active filters. The output of apparatus 10 is provided at an output terminal 38.

Figure 3A:
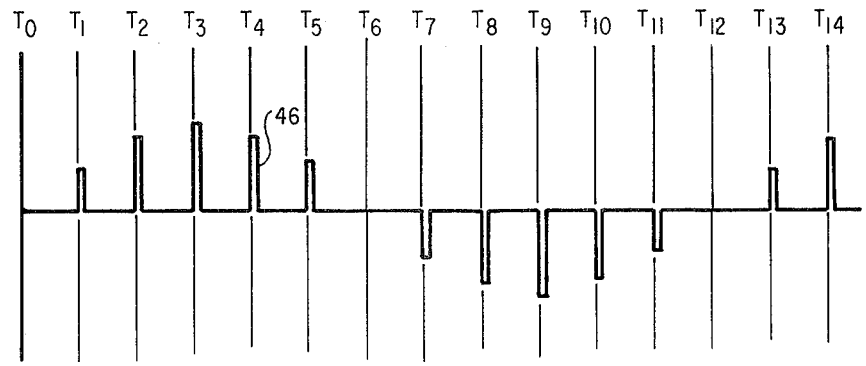
FIGS. 3a and 3b are a pair of waveforms illustrating the operation of the sample and hold circuit stage of the apparatus of FIG. 1.
Figure 3B:
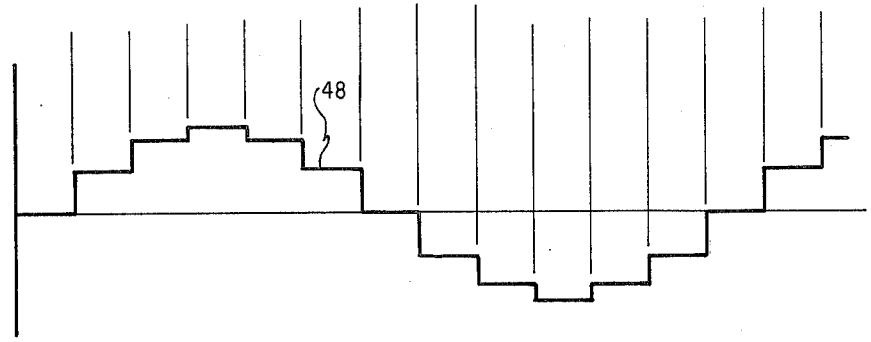
Figure 4:
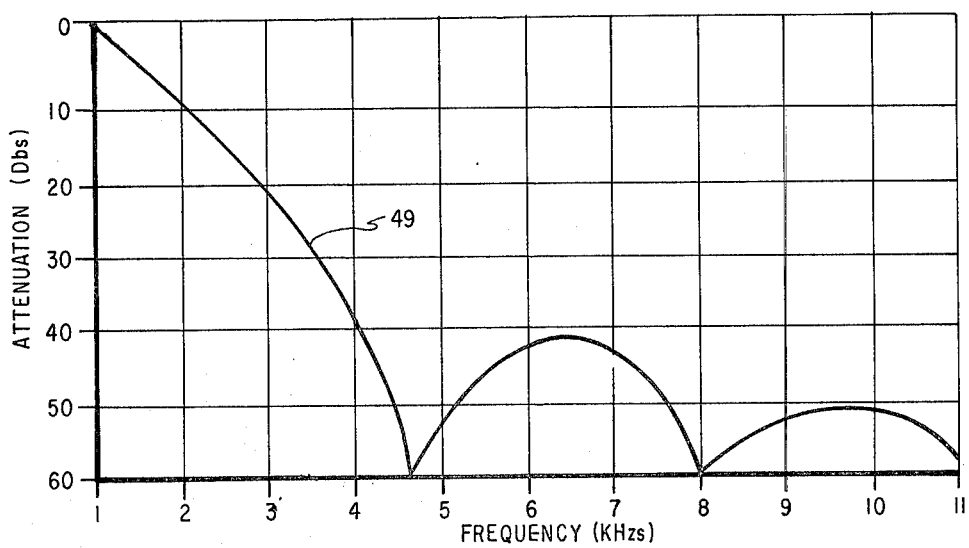
FIG. 4 is a graph depicting the frequency response characteristics of the sample and hold stage of the apparatus of FIG. 1.

Sample and hold circuit 12 includes an electronic analog switch 40, a capacitor 42, and a conventional buffer amplifier 44. Switch 40 is a conventional so-called "analog circuit type switch" employed in PAM multiplexing systems in the telephonic communications art. The PAM signal, illustrated by waveform 46, FIG. 3a, is received at input terminal 19 and consists of varying amplitude signals received at predetermined period of time slot intervals. The amplitude and polarity of the pulses present at the time slot intervals are samplings of a continuous analog signal, such as the voice signal through a telephone line system. For purposes of illustration, waveform 46 has been shown as sample intervals of a sine wave. Switch 40 is a normally open switch which is actuated by the multiplexing system to its closed circuit condition during presence of the time slot pulse applied to terminal 19. Switch 40 has a low ON resistance when closed and a high OFF resistance when open, thereby charging or discharging capacitor 42 to the peak value of the PAM input pulse during the time slot interval and preventing discharge of capacitor 42 when in its OFF condition. Buffering amplifier 44 has a very high input impedance and a very low output impedance, with a gain of unity. The high input impedance of amplifier 44 does not allow capacitor 42 to discharge through ground when switch 40 is in its open circuit condition. The energy of each input pulse is therefore stored until the next closing of switch 40. This in effect stretches the pulse width, thereby producing waveform 48, FIG. 3b, at the output of amplifier 44. The frequency response characteristic of sample and hold circuit 12, curve 49, FIG. 4, is a $$\frac{\sin x}{x}$$

function with attenuation nulls at the sampling frequency and multiples of the sampling frequency. Sample and hold circuits and their frequency response characteristics are well known. See J. G. Truxal, "Automatic Feedback Control System Synthesis", McGraw-Hill Book Company, Inc., New York 1955, pages 507, 508.

The output of sample and hold circuit 12 is applied to an input terminal 50 of the low frequency pole pair section 20 of the Cauer active filter network 14. Section 20 comprises an operational amplifier 52 as its active element, and passive filter networks consisting of two T-networks. One of the T-networks consists of a pair of capacitors 54 and 56 serially connected between input terminal 50 and the inverting input of operational amplifier 52, and a resistor 58 connected between the node between the capacitors and the output of amplifier 52. The other T-network consists of a pair of resistors 60 and 62 serially connected between input terminal 50 and the inverting input of amplifier 52, and a capacitor 64 connected from the node between the resistors and ground. A capacitor 65 is connected between the inverting input of the amplifier and ground. A resistor 66 is connected between the noninverting input of amplifier 52 and ground, and a resistor 68 is connected between the noninverting input of amplifier 52 and the output of amplifier 52.

The output of operational amplifier 52 is coupled to the high frequency pole pair section 22 of the Cauer active filter network 14. Section 22 includes an operational amplifier 70, an operational amplifier 72, and resistor and capacitor elements forming a complex filtering and feedback network. A resistor 74 couples the signal from filter section 20 to the inverting input of amplifier 70. The output of amplifier 70 is coupled to the noninverting input of amplifier 72 via a resistor 76. A capacitor 78 is connected between the output of operational amplifier 70 and the inverting input of operational amplifier 70. A resistor 80 is connected between the output of amplifier 72 and the noninverting input of amplifier 72. A resistor 82 provides an outer feedback loop between the output of amplifier 72 and the inverting input of amplifier 70. A resistor 84 is connected between the non-inverting input of amplifier 70 and ground and a capacitor 86 is connected between the noninverting input of amplifier 72 and ground. A resistor 88 is connected between the inverting input of amplifier 72 and ground, and a resistor 90 is connected between the noninverting input of amplifier 72 and the output of amplifier 72.

Figure 5:
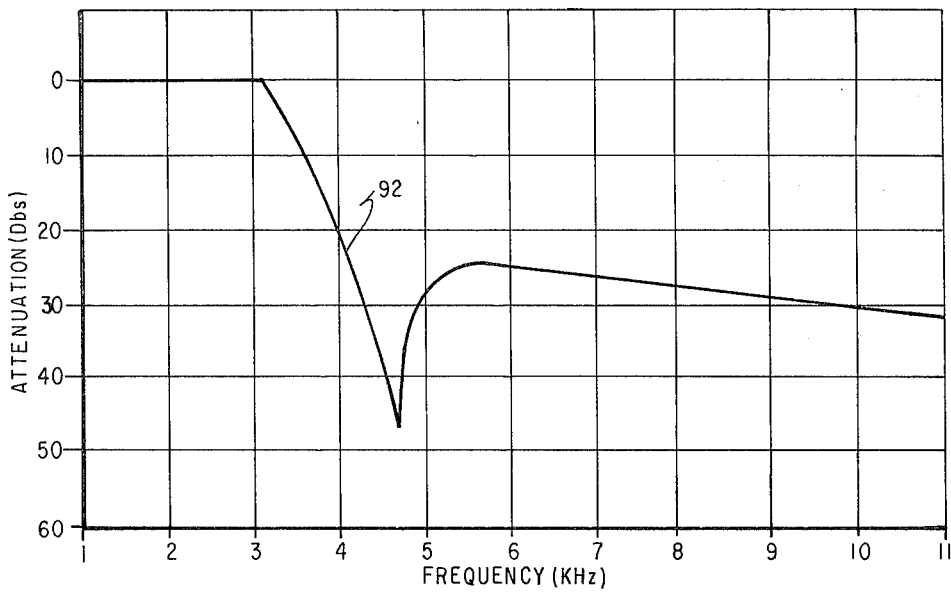
FIG. 5 is a graph depicting the frequency response characteristics of the four-pole, low-pass, RC filter network stage of the apparatus of FIG. 1.

The four-pole, low-pass, RC active filter network 14 formed by sections 20 and 22 is of the conventional CC type catalogued in A. I. Zverev, "Handbook Of Filter Synthesis", John Wiley and Sons, Inc., New York 1967. More particularly, it is of a CC-4-25-53 type, for which a description of low-pass filter model and other data pertinent to the transmission function is provided at page 198. A curve 92, FIG. 5, depicts the frequency response characteristics of network 14, in Dbs. vs. frequency (in KHz.)

Frequency response compensation resistor 16 is shunt connected between the inverted input of operational amplifier 52 of the low frequency filter network section 20 and ground. Its purpose will be described in the description of operation of apparatus 10, following. The procedure for determining the value of resistor 16 will be described in a subsequent paragraph.

Figure 6:
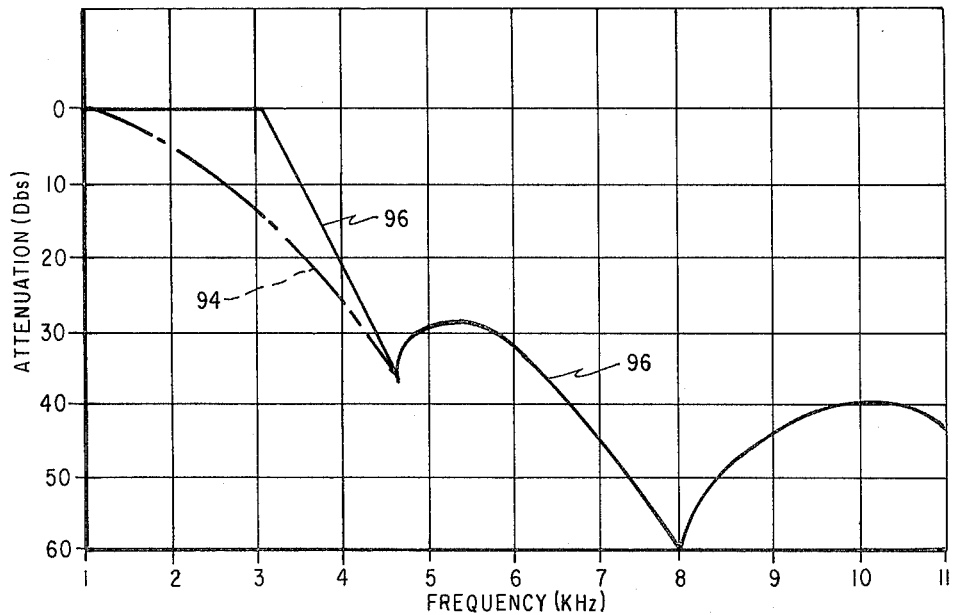
FIG. 6 is a graphical comparison of the frequency response characteristics of the apparatus of FIG. 1 (solid line) with same for the case of such apparatus without the presence of a frequency response compensation resistor (broken line)

In the operation of apparatus 10, the placement of sample and hold circuit 12 ahead of filter network 14 (but without resistor 16) causes a combined frequency response characteristic as depicted by broken curve 94, FIG. 6. (Beyond the first null, the curve 94 merges with solid line curve 96.) It will be appreciated that the decline of frequency response in frequencies below the first null frequency causes a roll-off of the band-pass starting at 1 KHz, as compared to the flat in-band response of network 14, alone (cuved 92, FIG. 5). Compensation of this roll-off effect is accomplished by the resistor 16 connected between the inverted input of operational amplifier 52 and ground. The compensated response curve is indicated by a broken line curve 96, FIG. 6. The value of resistor 16 controls both the frequency and the Q of pole pair 26 and 26j, FIG. 2, of low frequency section 20. What this does is to move the complex pole pair of section 20 from their predetermined pattern of pole locations relative to the s-plane coordinates such that the frequency response is flattened out to 3 KHz. It would be noted that the actual predetermined pattern of location of pole pairs 26 and 26j is solely of academic significance in the practice of this invention. The important thing is that the innate characteristic pattern of pole locations of network 20 (i.e., without connection of resistor 16) must be adjusted.

Empirical procedures for determining a value for resistor 16, are the most direct and inexpensive. Apparatus 10 is operated with conventional test equipment to provide measurements to determine the apparatus' frequency response, and different values of resistor are tried until the desired flattening is achieved.

An alternate procedure for determining the value of resistor 16 would be the computer modeling of the combined transfer functions of sample and hold circuit 10, and low-pass filter network 14 including compensation resistor 16, and manipulation of the model (by value finding computer program routines or by human operator interaction) to solve for a value of resistor 16 giving a response characteristic shape of curve 96, FIG. 6, out to 4.5 KHz.

A conventional analysis of circuit 12 using well-known techniques associated with the La Place form of notation yield the following transfer function equation:

$$G_{H(s)} = \frac{1 - e^{-Ts}}{S}$$

Where $T$ = sampling period, and $S = j\omega$ in La Place notation. Such conventional analysis of network 14 yields the transfer function, HS, set forth in FIG. 7.

A capacitor, or a combination of capacitance and resistance, may be employed in place of resistor 16. Again empirical procedures in choice of values are the most direct, but manipulation of a computer model of the transform could be used.

The advantages of the invention are readily apparent. The sample and hold effectively stretches the duty cycle of the incoming pulse train to 100%, causing the gain of the entire circuit to become substantially independent of sampling time or incoming pulse width of a PAM input signal. Thus, the requirement of gain of the active filter is substantially reduced. For example, apparatus 10 achieves effective results for the requirements of noise rejection in telephonic communication channels employing PAM signals with its single low-pass active filter stage 14. Prior to the present invention, several stages like low-pass filter network 14 were required to perform the same function. Also, noise rejection action is improved by the nulls at the sampling frequency and multiples of the sampling frequency of the frequency response characteristics of sample and hold circuit 12. These attenuation nulls help improve the out-of-band rejection of apparatus 10 as is apparent from a comparison of curve 96, FIG. 6 with curve 92, FIG. 5.

The invention has been described in the context of a PAM signal channel in which a sampling switch 40 is inherently operated in synchronous timed relationship to a train of pulses. However, it will be readily appreciated that the advantage of improved out-of-band rejection can be achieved in connection with a continuous input signal by suitable operation of the switch 40 to periodically sample and hold the value of the continuous input signal.

Typical values of circuit elements for apparatus 10 are as follows:

| | |
|---|---|
| Capacitor 42: | 4,300 Pfd. |
| Capacitors 64 & 86: | 2,000 Pfd. |
| Capacitors 51, 56 and 78: | 1,000 Pfd. |
| Capacitor 65: | 1,100 Pfd. |
| Resistor 16: | 113 K ohm |
| Resistor 58: | 17.8 K ohm |
| Resistors 60, 62 and 68: | 34.8 K ohm |
| Resistor 66: | 42.2 K ohm |
| Resistor 74: | 2.1 K ohm |
| Resistor 76: | 46.4 K ohm |
| Resistor 80: | 93.1 K ohm |
| Resistor 82: | 116.4 K ohm |
| Resistor 84: | 10 K ohm |
| Resistors 88 and 89: | 69.8 K ohm |

Operational amplifiers 44, 52, 70 and 72: Type 748 C integrated circuit operational amplifiers manufactured by several semiconductor companies under this standard type number.

It will be understood by those skilled in the art that numerous variations and modifications may be effected to the preferred embodiment without departing from the spirit and scope of the invention as hereinafter claimed.

What is claimed is:

1. For use in a signal transmission system which propagates pulse amplitude modulated (PAM) signals comprising pulses having a predetermined periodicity and in which it is desired to pass signals in a predetermined frequency band below about 4 KHz, low-pass active filter apparatus comprising:

a. first means which receives said PAM signal and produces at the output thereof the amplitude of each pulse of the PAM signals for the full period of the PAM signal rate, b. a four-pole, low-pass, RC active filter network connected to the output of said first means, said active filter network comprising one and another series connected second-order active filter sections, said one and another active filter sections comprising a low frequency pole pair section and a high frequency pole pair section, respectively, c. said one low frequency pole pair, second-order, active filter section, per se, having predetermined low-pass filter operation characteristics representable in an s-plane graphical depiction of active circuit operation as a predetermined pattern of location of a complex pole pair relative to the s-plane coordinates, d. said first means, per se, having a frequency response which causes undesired frequency roll-off in the desired pass band below 4 KHz, and e. second means operatively associated with said one low frequency pole pair, second-order, active filter section for causing the complex pole pair to be moved away from said predetermined pattern of location such that the undesired frequency roll-off characteristic due to the first means is compensated to provide desired in-band frequency characteristics throughout said predetermined frequency band.

2. Apparatus in accordance with claim 1, wherein:

a. said one low frequency pole pair, second-order, active filter section comprises first and second input terminals, an operational amplifier having an inverting input, a noninverting input, and an output, first and second resistors connected in series between said first input terminal and said inverting input of the operational amplifier, a first capacitor connected between the node between said first and second resistors and said second input terminal, second and third capacitors connected in series between said first input terminal and said inverting input of the operational amplifier, a third resistor connected between the output of said operational amplifier and the node between said second and third capacitors, a fourth resistor connected between the noninverting input of said operational amplifier and said second input terminal, a fourth capacitor connected between said inverting input of the operational amplifier and said second input terminal, and a fifth resistor connected between the output of said operational amplifier and the noninverting input of the operational amplifier, and b. said second means comprises a passive impedance element connected between the inverting input of said operational amplifier and said second input terminal.

3. Apparatus in accordance with claim 2, wherein:

a. said passive impedance element is a resistor having a predetermined magnitude.

4. Apparatus in accordance with claim 1, wherein:

a. said first means comprises an analog circuit type multiplexing switch operatively connected to a store and hold capacitor to establish an input pulse value across a store and hold capacitor when in its closed condition, b. a buffering operational amplifier operatively connected to said store and hold capacitor through which the signal established across said store and hold capacitor is applied to said one low frequency pole pair, second-order, active filter section, and c. said analog circuit type multiplexing switch being operative to close in synchronously timed relationship to the appearance of PAM signal pulses.

* * * * *